United States Patent
Kirsten

(10) Patent No.: US 6,898,071 B2
(45) Date of Patent: May 24, 2005

(54) ELECTRICAL MULTILAYER COMPONENT AND METHOD FOR THE PRODUCTION THEREOF

(75) Inventor: Lutz Kirsten, Deutschlandsberg (AU)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 10/475,755

(22) PCT Filed: Apr. 11, 2002

(86) PCT No.: PCT/DE02/01360
§ 371 (c)(1),
(2), (4) Date: Oct. 24, 2003

(87) PCT Pub. No.: WO02/089160
PCT Pub. Date: Nov. 7, 2002

(65) Prior Publication Data
US 2004/0121179 A1 Jun. 24, 2004

(30) Foreign Application Priority Data
Apr. 26, 2001 (DE) .......................... 101 20 517

(51) Int. Cl.$^7$ ................................. H01G 7/06
(52) U.S. Cl. ............... 361/307; 361/321.2; 361/321.3; 361/321.4; 361/308.1; 156/89.12; 156/89.14; 156/89.16; 156/89.19; 428/210
(58) Field of Search .............. 361/321.2, 321.3, 361/307, 308.1, 321.4; 156/89.12, 89.14, 89.16, 89.19

(56) References Cited

U.S. PATENT DOCUMENTS

| | | | |
|---|---|---|---|
| 3,612,963 A | * 10/1971 | Piper et al. | ............... 361/321.3 |
| 4,831,432 A | 5/1989 | Hori et al. | |
| 6,080,328 A | 6/2000 | Horikawa | |
| 6,159,267 A | 12/2000 | Hampden-Smith et al. | |
| 6,295,196 B1 | * 9/2001 | Hamaji et al. | ........... 361/321.2 |
| 6,320,738 B1 | * 11/2001 | Yamana et al. | .......... 361/321.2 |
| 6,503,609 B1 | 1/2003 | Lobl et al. | |

FOREIGN PATENT DOCUMENTS

| | | |
|---|---|---|
| DE | 38 30 174 | 6/1992 |
| DE | 196 20 446 | 11/1996 |
| DE | 197 19 174 | 11/1998 |
| DE | 199 16 380 | 10/1999 |
| DE | 199 02 769 | 7/2000 |
| EP | 0 514 149 | 11/1992 |
| EP | 1 022 769 A2 | 7/2000 |

* cited by examiner

Primary Examiner—Cathy F. Lam
(74) Attorney, Agent, or Firm—Fish & Richardson P.C.

(57) ABSTRACT

An electrical component includes a stack of layers. The layers include dielectric layers and electrode layers. The dielectric layers have a resistance with a positive temperature coefficient. The electrode layers are electrically conductive and are interspersed among the dielectric layers. At least one of the electrode layers includes a constituent that is comprised of a base metal and that is at least partially coated with a protective layer. The protective layer includes a material that slows oxidation of the base metal.

18 Claims, 1 Drawing Sheet

ELECTRICAL MULTILAYER COMPONENT AND METHOD FOR THE PRODUCTION THEREOF

BACKGROUND

The invention concerns an electric multilayered component with a stack of layers, which include superimposed dielectric layers that cover a ceramic material and electro-conductive electrode layers lying between them. Beyond that, the invention concerns a method for producing the multilayered component.

In patent DE 197 19 174 A1, a component of the above type is known where the electric resistance of the dielectric layers exhibits a positive temperature coefficient and where the electrode layers are produced from aluminum. To produce such a multilayered PTC resistor, the use of base metal for an electrode layer is necessary, because only such metals form, for the purpose of a PTC element, a necessary oxide layer on their surfaces. This oxide layer is required for the barrier, which is a layer that may be dismantled, between the electrode and dielectric layers.

The known component has the disadvantage that aluminum used for PTC resistor ceramic is not stable and oxidizes at typical sinter temperatures >1300° C. The electrode layers therefore exhibit a high ohm resistance due to the sinter that is undesirable for a multilayer PTC resistor.

Furthermore, the known PTC component has the disadvantage that aluminum is easily diffused into the ceramic at the highest sinter temperatures of >1000° C. and impairs the desired characteristics of the PTC ceramic.

Moreover, the elements of the aforementioned method are known from patent DE 199 16 380 A1 where the dielectric layers are selected from a piezoelectric material. The electrode layers are produced from a mixture of silver and palladium These known components have the disadvantage that the materials, silver and palladium, are expensive to obtain. More easily and cheaply available materials, such as copper, require a very high, process-technical method in order to oxidize the copper.

SUMMARY

It is therefore the intent of the present invention to provide an electric multilayered component that allows a usable metal to protect electrode layers before they oxidize at high temperatures in oxygenated atmospheres.

According to the invention, this goal is attainable with a multilayered component described in claim 1. Other forms of the invention and a method for producing the invention are to be inferred from further claims.

The invention is directed to an electric multilayered component that includes a stack of layers with superimposed dielectric layers. The dielectric layers include a ceramic material and are arranged and separated from one another by electro-conductive electrode layers lying between them. At the least, an electrode layer includes a body covered by a protective layer. The body includes a metal. The protective layer has the task of hindering and slowing down oxidation of the body. Metals, particularly precious metals that exhibit a greater standard electrode potential than the metal in the body, should be considered for use in a protective layer. Another suitable compound such as boron- or silicon-comprised glass, for example, could also comprise the protective layer.

Condensers, pyroelectric conductors, resistors and piezoelectric components, in particular, are possibilities of multilayered components, according to the invention.

The multilayered component, according to the invention, has the advantage that, due to the protective material included in it, the protective layer shields the body from unwanted oxidation. In particular, the invention makes possible the use of base metals as the metal for the body. The base metals have the advantage that they are cheap and easily accessible. To clarify: the standard electrode potential measured against a standard hydrogen electrode at 25° C. is negative for all metals besides base metals.

Beyond that, the component according to the invention permits the application of process steps where the component is exposed during or after the production of the oxygenated atmosphere. On account of the protective layer, a multilayered component without a protective layer where the electrode layer is not completely oxidized can be used rather than either a higher partially pressurized oxygen or a higher temperature within the component or both. This is a particular advantage if a sinter process produces the multilayered component. Using base metals in electrode layers, the partially pressurized oxygen, usually very accurately reduced by air, must be regarded while sintering. The component, according to the invention, now makes it possible to accomplish a sintering with relatively high partially pressurized oxygen. This possibility simplifies the process as well as reduces its costs.

Common sintering of ceramic green foils and electro-conductive layers can produce a component, according to the invention, with particular advantages. Such sintering will make it possible, in an easily carried-out process, to stack many layers on top of one another and to combine them, in one single step, into a monolithic component. In particular, the common sintering of ceramic green foils with electrode layers allows the production of components with very many electrode layers that can be used, for example, by condensers at a high capacity, by multilayered PTC resistors at a low resistance, and by piezoelectric components at a high mechanical deflection.

Beyond that, in one implementation of advantage, outer electrodes, which are in contact with the electrode layers, can be arranged along the outer surface of the component, according to the invention. This implementation makes it possible to produce multilayered components suitable for surface montage technology. Suitable outer electrodes would be, for example, electrodes arranged cap-like along two surfaces on opposite sides of the stack of layers. These electrodes can be easily soldered with conductive strips on a conductive plate using surface montage technology.

An advantageous and broader implementation of the invention includes contact between neighboring electrode layers with different outer electrodes. With this it is possible to arrange the electrode layers in the form of interlinking comb structures. In particular, it can achieve a high capacity via parallel circuitries for condensers with capacities in different parts, a reduced ground resistance via parallel circuitries for multilayered PTC resistors of partial resistance, and an increased mechanical deflection for piezoelectric components.

In order to satisfy the requirements for specific sinter processes at temperatures >800° C., it is advantageous to select protective material that also slows down the oxidation of the body at sinter temperatures >800° C. With this it will be possible to create ceramic multilayered components with base metals in the electrode layers that would become oxidized without a protective layer at the aforementioned sinter temperatures. Such ceramic components are, for example, piezo-actuators or multilayered PTC resistors.

While particular base metals could be considered for the metal of the body, precious metals, which exhibit temperature characteristics suitable for sintering in air, have been preferably used for the protective material. In particular, silver, gold, platinum or palladium should be considered as the precious metals. However, other materials are also possible, such as boron- or silicon-comprised compounds, for example.

Suitable metals for the body are, in this case, tungsten, copper, nickel, chromium, aluminum or titanium. The metal, tungsten, is, in this case, also a suitable alternative for producing multilayered PTC resistors. Chromium and zinc also work as alternatives. Copper is particularly suitable for producing piezoactuators, while the metal, nickel, together with a protective layer, according to the invention, proves favorable for condensers that can simplify processing on account of possible sintering in air rather than sintering with reduced oxygen content.

To create a ceramic multilayered PTC resistor, it is of particular advantage if the ohm resistance of the dielectric layers exhibits a positive temperature coefficient. This is possible, for example, by using PTC resistor ceramics. A suitable PTC resistor ceramic is, in this case, a barium titanate ceramic of a common compound (Ba, Ca, Sr, Pb) TiO3 that is comprised of donators and/or acceptors, in this case, manganese and yttrium.

By using such a ceramic, preferably for the barrier, a layer that may be dismantled, alternative base metals, such as aluminum, chromium or zinc, can be used in the electrode layers. However, tungsten, in particular, is also a suitable metal for the electrode layer. To clarify: beneath the barrier, base metals have been oxidized at the electrode/ceramic border, and the charge carrier concentration on an edge between electrode and dielectric layers has been increased (accumulation=edge). A resistive contact has been constructed, which is necessary for multilayered PTC resistors to function. Without a protective layer, the named metals would, however, be completely oxidized during sintering in air. Such a layer is necessary for the simple creation of multilayered components for PTC resistor ceramics at typical sinter temperatures. Electrode layers and ceramic would, therefore, not be needed, because the oxidized electrode components diffuse out of the electrode/ceramic border and into the ceramic. Sintering in an oxygenated atmosphere is necessary in order to construct actively seeded borders of the PTC resistor ceramic, which are used for cooling after the sintering. With help from the protective layer, however, necessary sinter conditions can be carried out without completely oxidizing electrode layers or alternatives for electrodes.

Multilayered PTC resistors have been used for the purpose of protecting components or modules from high currents. With a sudden rise in current, the resistance of multilayered PTC resistors increases very strongly, whereby a serially circuited component for the multilayered PTC resistor or the circuit, itself, can be effectively protected from a current overflow. After removing the flawed condition, which resulted from the higher current, the multilayered PTC resistor cools off and returns again to a low ohm resistance. Ceramic multilayered PTC resistors have the advantage, due to parallel circuitry of multiple single resistors, that they exhibit a very low partial resistance at low temperatures. Also, they always reliably achieve that low resistance again after repeated rises and falls of the current flowing through the PTC resistor.

With the implementation of the component, according to the invention, for multilayered PTC resistors, other materials, which comprise chemical compounds of tungsten, could particularly be considered for the body. In particular, tungsten carbide or tungsten nitride comes to mind. Tungsten compounds have the advantage that the oxidation of tungsten has been slowed down or nearly prevented so that the necessary barrier, a layer that may be dismantled, can still develop and is ensured despite a high conductivity within the electrode layer.

In one implementation of the invention, the electrode layers can include a body that may be comprised of layers. In each case, a protective layer is arranged on the body's top and bottom sides.

In a further implementation of the invention, the body, arranged into electrode layers, can also be made from a protective layer of particles. This implementation of the invention makes the use of powders possible. The powders include a multiplicity of such particles for producing electrode layers by which the use of known (silk-) screen-printing has been made possible. By using powder, an advantage that no new technologies can be developed for applying electrode layers to ceramic green foils and/or for their further processing results.

Beyond that, using coated particles in the electrode layer of multilayered PTC resistors has an advantage if the electrode layer next to the particles still includes a precious metal like silver or palladium so that a higher conductivity within the electrode layer has also been ensured for partial oxidation of the responsive electrode components at the barrier, a layer that may be dismantled, in the core of the particle. An electrode layer of a multilayered PTC resistor can, for example, be created with 10% (by weight) of coated tungsten powder and 90% (by weight) of a silver and palladium mixture.

Furthermore, the protective layer can exhibit at least two parts that include different materials in the layer. For example, it comes to mind that a powder should be used for the electrode layers, the particles of which are essentially created from tungsten at their core, whereby a silver layer has coated the core of the particles. The silver-comprised coating is covered again by a second wrapping that includes palladium. One implementation of the protective layer, such as a double layer, has the advantage that during the heating process for sintering the component, an alloy can form out of the silver and platinum. This alloy melts at a higher temperature than silver (silver melts at approximately 900° C.) and can therefore eliminate the need for a partial barrier, a layer that may be dismantled. The protective layer thus does not allow too much oxygen to be admitted to the tungsten in the particle's core.

A suitable powder for use in the multilayered component, according to the invention, can be produced using a physical method, for example, that coats particles of a suitable metal with a layer of a precious metal. Sputtering or evaporating should be considered for the physical method to produce powder, the particles of which are coated. With this, however, that the particles of the powder must be moved during the evaporating or sputtering so that they have been coated on all sides must also be considered.

Boron- or silicon-comprised glass, used as the protective material, can be crushed into a powder form of a protective layer by a chemical procedure such as PVD or CVD.

Using the multilayered component, according to the invention, as a piezo-actuator or as a condenser, has an advantage if the protective layer densely encloses the bodies. In these cases, oxidizing the body is not desirable. By densely enclosing the body within the protective layer, the increase of oxygen, predicted from the oxygen transported by means of diffusion, can be decreased to a large extent.

With the named method for producing powder, the particles of which are coated, protective layers develop that exhibit pores. As an advantage, these pores can allow oxygen to be admitted to the particle's core and therefore service the barrier, a layer that may be dismantled, in the multilayered PTC resistors. On the other hand, however, in order to prevent the admission of too much oxygen to the body, it can be advantageous to select thick layers of the protective layer that reduce pore development and, as a result, reduce to an acceptable measurement the admission of oxygen through the barrier, a layer that may be dismantled. A suitable thickness for the protective layer amounts to <5 Tm with regard to an often used (silk-) screen-printing method.

Furthermore, there is an advantage if the particles, included within the powder that has been used as a paste for producing the electrode layers, exhibit an expansion of typically <5 $\mu$m. Similarly, it is also advantageous if the protective layer exhibits a thickness of typically <5 $\mu$m. Such particle dimensions have the advantage that the usual sieves for (silk-) screen-printing can be used of laying electrode layers on ceramic green foils. Average sieves typically have a mesh size smaller than 5 $\mu$m.

However, other strong relationships between a particle and a protective layer are probable.

Furthermore, the invention concerns a method for producing an electric multilayered component, whereby the sintering of layers has been accomplished at temperatures of typically above 800° C.

Such a method has the advantage that the necessary sinter temperature for many applications and/or ceramic materials can be achieved. Beyond that, on account of the protective layer, according to the invention, inexpensive materials should be considered for the metal of the body.

Beyond that, a method for producing multilayered PTC resistors has an advantage when the sintering of the stack of layers occurs in an atmosphere where the partially pressurized oxygen equilibrium of the body metal/body metal oxide equilibrium is exceeded. Such a method has the advantage that with the oxygen pressure increased, in this case, by air that can occur during sintering, the process for producing the component has been decidedly simplified. For example, this result can occur from using tungsten as the metal for the body in an oxygenated atmosphere that exceeds the partially pressurized tungsten/tungsten oxide equilibrium.

Thus, the necessary high-oxygen portion of the sinter atmosphere has been supplied for many ceramics, whereby the protective layer effectively shields the base metal, in this case, tungsten, from the high partially pressurized oxygen.

The invention has been described on the basis of examples of implementations and, in the following, those are clarified by the figures that apply to them.

DETAILED DESCRIPTION

Figure 1:
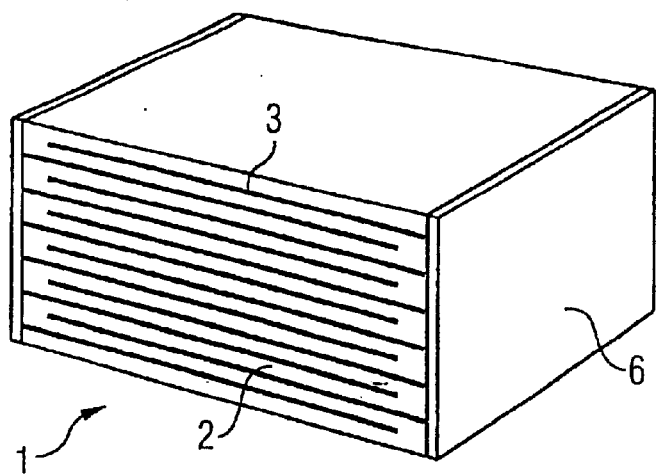
FIG. 1 shows, in this case, a multilayered component, according to the invention from a perspective view.

FIG. 1 shows a component, from a perspective view, which has been produced by sintering of a stack of superimposed green foil and electrode layers. On a surface of a green foil, an electrode paste has additionally been applied to the electrode in the indicated range. Additionally, a set of thick-layering methods, preferably imprinting, are, themselves, suitable, in this case, for (silk-) screen-printing. A surface area not covered by electrode paste remains at least within the range of the green foil's edge or only within the range of the green foil's corner. It is also possible not to use the electrode in a two-dimensional layer but instead in a structure and, if necessary, open pattern.

The (silk-) screen-printing paste exhibits, using metallic tungsten or a tungsten compound, for example, extensive particles for producing the desired conductivity and, if necessary, sinterable, ceramic particles for adjusting the weakened characteristics of the electrode paste to that of the ceramic and an extinguishable, organic bond, in order to ensure a malleability of the ceramic mass and/or an adhesion of the green bodies. Therefore, particles of pure tungsten, particles of tungsten alloys, tungsten compounds or mixed particles of tungsten, and other metals can be used. A protective layer, according to the invention, therefore coats the particles (compare FIGS. 2A and B). With ceramic multilayered components, which only a small mechanical load has suspended, it is also possible to do entirely without the electrode paste for the ceramic portion.

Subsequently, the printed green foils have been superimposed, in a desired number, on a stack of foils where (green) ceramic layers and electrode layers are arranged, alternating one on top of another.

Subsequently, the stack of layers, still elastic because of the bond, has been molded into the desired outer shape by pressing and, if necessary, by cutting. The ceramic is then sintered in what can be a multi-step process. The final sintering, which sinters together the ceramics until completed and/or until the desired compression, occurs, as a rule, between 800 and 1500° C.

After sintering, a monolithic ceramic stack of layers 1 develops from the single layers of green foil, which exhibit a tight group of dielectric layers 2 formed from single, ceramic layers. This tight group is also found at the junction points between ceramic/electrode/ceramic. In the stack of layers 1, dielectric layers 2 and electrode layers 3 are arranged, alternating one on top of another. Outer electrodes 6 have now been produced for two of the other sides, lying opposite each other, in the component body. In each case, the outer electrodes stand electrically in contact with each second electrode layer 3. Additionally, in this case, a ceramic metallurgy can be produced usually from silver, in this example, by a current separation. This can subsequently be strengthened exceedingly, for example, by using an order of layers Ag/Ni/Sn. The soldering ability for platinum has therefore been improved. However, other possibilities are suitable for making electrode layers 6 into metal and/or producing them.

The following advantages have been achieved using coated tungsten particles in accordance with FIG. 2, including electrode layers connected with a PTC resistor ceramic.

a. minimization of oxidation, therefore minimized expansion of volume
b. improvement of ceramic's adhesive strength
c. improvement of electric conductivity resulting from less oxidation
d. better ability to make compounds from a paste made of silver that can be used for engraving on electrode layers; the compounds can be used for outer metallurgy
e. load distribution within the layer has been comparably moderated due to an improved homogeneity resulting from less oxidation
f. the barrier, a layer that may be dismantled, has been made using tungsten in combination with PTC resistor ceramic, producing a resistive contact The invention does not limit itself to PTC resistor ceramics with tungsten-comprised electrode layers, but instead is applicable to many other types of electro-ceramic components, such as, in this case, condensers or piezo-components, which may preferably find use in perowskit ceramic or in heat conduction associated with spinel ceramic. Beyond that, such components, according to the invention, should be considered with which the ceramic layers include a zinc oxide ceramic and are therefore suitable as resistors. Beyond that, the component, according to the invention, can be used as, in this case, a PTC resistor with dielectric layers, barium titanate ceramic with the additions: barium, titanium, calcium, strontium or lead and/or further remunerative elements.

Figure 2A:
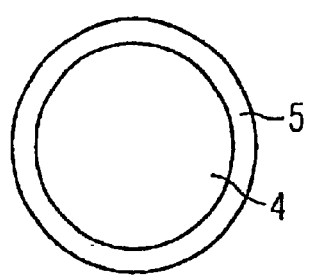
FIG. 2A shows the particles of a powder, which can be used for producing electrode layers in the component, according to the invention, from a schematic cross-sectional view.
Figure 2B:
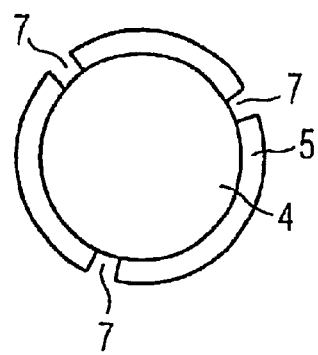
FIG. 2B shows a particle in accordance with FIG. 2A, the protective layer of which exhibits pores.

FIG. 2A shows a body 4 in the form of a particle, which is coated by a protective layer 5 that densely encloses the particle. In order to achieve the necessary partial oxidation for use in multilayered PTC resistors, porous protective layers can be produced and/or the dense part of the protective layer can be adapted so to allow the admission of small amounts of oxygen into the body. FIG. 2B shows such a particle, the protective layer 5 of which contains pores 7. The body 4 can, in this case, be created from tungsten, while the coating is created from palladium as the protective material.

Figure 3:
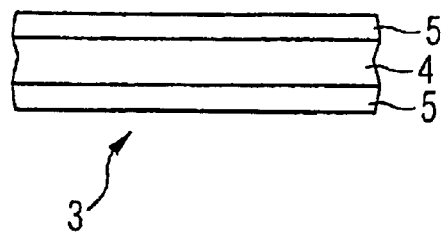
FIG. 3 shows, in this case, the structure of a component's electrode layer, according to the invention, from a schematic cross-sectional view.

FIG. 3 shows an electrode layer 3, with which the body 4 exhibits the form of a layer that is covered by a protective layer 5 along the top and undersides. The protective layer 5 can, in this case, be created from palladium, while the body 4 can include tungsten.

The invention does not limit itself to the described examples of implementations but instead has been defined in its most general form by claim 1.

What is claimed is:

1. An electrical component comprising:
    a stack of layers, the layers comprising:
        dielectric layers comprised of a ceramic material; and
        electrode layers between at least some of the dielectric layers;
    wherein at least one of the electrode layers comprises a body that has top and bottom sides that are covered by a protective layer, the body comprising metal, and the protective layer comprising a protective material that slows oxidation of the metal.

2. The electrical component of claim 1, wherein the dielectric layers comprise ceramic green foils that are sintered jointly with the electrode layers.

3. The electrical component of claim 1, wherein the protective material slows oxidation of the metal during sintering at temperatures >800° C.

4. The electrical component of claim 1, wherein the metal comprises a base metal.

5. The electrical component of claim 1, wherein the protective material comprises a precious metal.

6. The electrical component of claim 1, wherein the metal comprises at least one of tungsten, copper, nickel, aluminum, titanium and chromium.

7. The electrical component of claim 1, wherein the protective material comprises at least one of gold, silver, platinum and palladium.

8. The electrical component of claim 1, wherein a resistance of the dielectric layers has a positive temperature coefficient.

9. The electrical component of claim 1, wherein the electrode layers include at least one of tungsten carbide and tungsten nitride.

10. The electrical component of claim 1, wherein the protective layer is comprised of a plurality of materials.

11. The electrical component of claim 1, wherein the electrode layers are produced from a powder comprised of particles, and particles of the at least one electrode layer are coated with the protective material via a chemical process or a physical process.

12. The electrical component of claim 1, wherein the protective layer restricts exposure of the body to oxygen.

13. The electrical component of claim 1, wherein the protective layer is porous.

14. The electrical component of claim 1, wherein the electrode layers are produced from a powder comprised of particles, particles of the at least one electrode layer have a maximum expansion of 5 μm, and the protective layer has a maximum thickness of 5 μm.

15. The electrical component of claim 1, further comprising: outer electrodes that contact the electrode layers, the outer electrodes being on outer surfaces of the stack of layers.

16. The electrical component of claim 15, wherein adjacent electrode layers contact different outer electrodes.

17. A method of producing an electrical component comprised of a stack of layers, the stack of layers comprising dielectric layers comprised of a ceramic material and electrode layers between at least some of the dielectric layers, at least one of the electrode layers comprising a body that has top and bottom sides that are covered by a protective layer, the body comprising metal and the protective layer comprising a protective material that slows oxidation of the metal, the method comprising:
    sintering the dielectric layers and the electrode layers at temperature > 800 °C, the dielectric layers comprising green foil.

18. The method of claim 17, wherein sintering is performed in an oxygenated atmosphere where an oxygen partial pressure of the atmosphere exceeds an equilibrium oxygen partial pressure of metal/metal oxide in the body of the electrode.

* * * * *